United States Patent
Tsukada (10) Patent No.: US 10,635,387 B2
(45) Date of Patent: Apr. 28, 2020

(54) PARAMETER CONTROL DEVICE, PARAMETER CONTROL PROGRAM, AND PARAMETER CONTROL METHOD

(71) Applicant: YAMAHA CORPORATION, Hamamatsu-shi (JP)

(72) Inventor: Keisuke Tsukada, Hamamatsu (JP)

(73) Assignee: YAMAHA CORPORATION, Hamamatsu-Shi (JP)

( * ) Notice: Subject to any disclaimer, the term of this patent is extended or adjusted under 35 U.S.C. 154(b) by 68 days.

(21) Appl. No.: 15/818,077

(22) Filed: Nov. 20, 2017

(65) Prior Publication Data

US 2018/0074784 A1 Mar. 15, 2018

Related U.S. Application Data

(63) Continuation of application No. PCT/JP2016/067827, filed on Jun. 15, 2016.

(30) Foreign Application Priority Data

Jun. 16, 2015 (JP) ................. 2015-121464

(51) Int. Cl.
*G06F 3/16* (2006.01)
*G06F 3/0488* (2013.01)
(Continued)

(52) U.S. Cl.
CPC .......... *G06F 3/165* (2013.01); *G06F 3/04847* (2013.01); *G06F 3/04883* (2013.01);
(Continued)

(58) Field of Classification Search
CPC ... G06F 3/04883; G06F 3/04847; G06F 3/165
See application file for complete search history.

(56) References Cited

U.S. PATENT DOCUMENTS

2012/0306879 A1 12/2012 Yokoyama
2013/0038546 A1 2/2013 Mineo

FOREIGN PATENT DOCUMENTS

JP 2011113409 A 6/2011
JP 2012252642 A 12/2012
(Continued)

OTHER PUBLICATIONS

English translation of Written Opinion issued in Intl. Appln. No. PCT/JP2016/067827 dated Aug. 9, 2016, cited in IDS filed Nov. 20, 2017.
(Continued)

*Primary Examiner* — Li P Sun
(74) *Attorney, Agent, or Firm* — Rossi, Kimms & McDowell LLP (57) ABSTRACT

A parameter control device includes a processing unit, a display that displays an operated portion, and a memory. The processing unit detects an operation on the operated portion, updates a display position of the operated portion according to the operation on the operated portion, and updates a value of a parameter according to the operation on the operated portion. The processing unit updates the parameter according to an operation amount in a case where the operation amount with respect to the operated portion is equal to or lower than a prescribed threshold. The parameter is updated according to a value of the threshold in a case where the operation amount exceeds the threshold.

9 Claims, 8 Drawing Sheets

(51) Int. Cl.
*G06F 3/0484* (2013.01)
*H04Q 9/00* (2006.01)
*G08C 17/02* (2006.01)
*H04R 3/12* (2006.01)
*H03G 3/02* (2006.01)
*H04R 3/00* (2006.01)
*G06T 11/20* (2006.01)

(52) U.S. Cl.
CPC ............... *G08C 17/02* (2013.01); *H03G 3/02* (2013.01); *H04Q 9/00* (2013.01); *H04R 3/00* (2013.01); *H04R 3/12* (2013.01); *G06T 11/206* (2013.01); *G08C 2201/30* (2013.01); *G08C 2201/93* (2013.01); *H04R 2227/005* (2013.01); *H04R 2430/01* (2013.01)

(56) References Cited

FOREIGN PATENT DOCUMENTS

| | | |
|---|---|---|
| JP | 2013037556 A | 2/2013 |
| JP | 2013214877 A | 10/2013 |
| JP | 2014215634 A | 11/2014 |

OTHER PUBLICATIONS

International Search Report issued in Intl. Appln. No. PCT/JP2016/067827 dated Aug. 9, 2016. English translation provided.
Written Opinion issued in Intl. Appln. No. PCT/JP2016/067827 dated Aug. 9, 2016.
"AV Controller." Yamaha Corporation. 2015. Web. Nov. 17, 2017. Cited in Specification.
Office Action issued in Japanese Appln. No. 2015-121464 dated Apr. 2, 2019. English translation provided.

PARAMETER CONTROL DEVICE, PARAMETER CONTROL PROGRAM, AND PARAMETER CONTROL METHOD

CROSS REFERENCE TO RELATED APPLICATION(S)

This application is a continuation of International Patent Application No. PCT/JP2016/067827 filed on Jun. 15, 2016 which claims the priority of Japanese Patent Application No. 2015-121464 filed on Jun. 16, 2015, the contents of which are incorporated herein by reference in its entirety.

BACKGROUND OF THE INVENTION

1. Field of the Invention

The present invention relates to a parameter control technology which controls a parameter, such as a volume value, of an audio device.

2. Description of the Related Art

As an application program which controls audio equipment, there is a program which increases a volume value of the audio equipment by a fixed value (for example, 0.5 dB) according to an operation of clicking a "+" button and reduces the volume value of the audio equipment by a fixed value (for example, 0.5 dB) according to an operation of clicking a "−" button (for example, refer to "AV controller" as Non-Patent Literature 1 and JP-A-2013-214877 as Patent Literature 1).

In addition, as another application program, there is a program which increases and reduces the volume value of the audio equipment according to a sliding direction and sliding amount by performing a sliding operation on a slider to be displayed. In a case where the volume value is adjusted by performing the sliding operation, it is possible to rapidly increase and reduce the volume value, compared to the case where the volume value is increased or reduced by performing the operation of clicking the "+" button or the "−" button.

Patent Literature 1: JP-A-2013-214877
Non-Patent Literature 1: "AV controller", [online], 2015, Yamaha Corporation, [retrieved on Mar. 27, 2016], Internet <URL:http://jp.yamaha.com/sp/apps/av/av-controller/en/>

SUMMARY OF THE INVENTION

However, with the sliding operation, it is possible to rapidly increase and reduce the volume value but there is a case where it is difficult to minutely adjust the volume value. For example, since it is difficult to minutely move a slider, there is a case where it is difficult to minutely adjust the volume value to desired magnitude. Otherwise, there is a case where the slider is largely slid improvidently on a volume increase side, with the result that the volume value is largely increased for a short time, thereby unexpectedly being high volume.

A non-limited object of the present invention is to provide a parameter control device, a parameter control program, and a parameter control method which are capable of controlling a parameter, such as a volume value, of an audio device, to a desired value.

A parameter control device provided by an aspect of the present invention includes: a processing unit; a display that displays an operated portion; and a memory storing instructions to cause the processing unit to:

detect an operation on the operated portion; update a display position of the operated portion on the display according to the operation on the operated portion; update a value of a parameter with respect to controlled equipment according to the operation on the operated portion; update the parameter according to an operation amount in a case where the operation amount with respect to the operated portion is equal to or lower than a prescribed threshold; update the parameter according to a value of the threshold in a case where the operation amount exceeds the threshold; stop a process of updating the parameter in a case where the processing unit detects release of the operation on the operated portion; and in a case where the process of updating the parameter stops, update the display position of the operated portion to a display position according to the value of the parameter at that time.

According to the aspect of the present invention, it may be possible to control a parameter, such as a volume value, of an audio device, to a desired value.

DETAILED DESCRIPTION OF THE EXEMPLARY EMBODIMENTS

Figure 1:
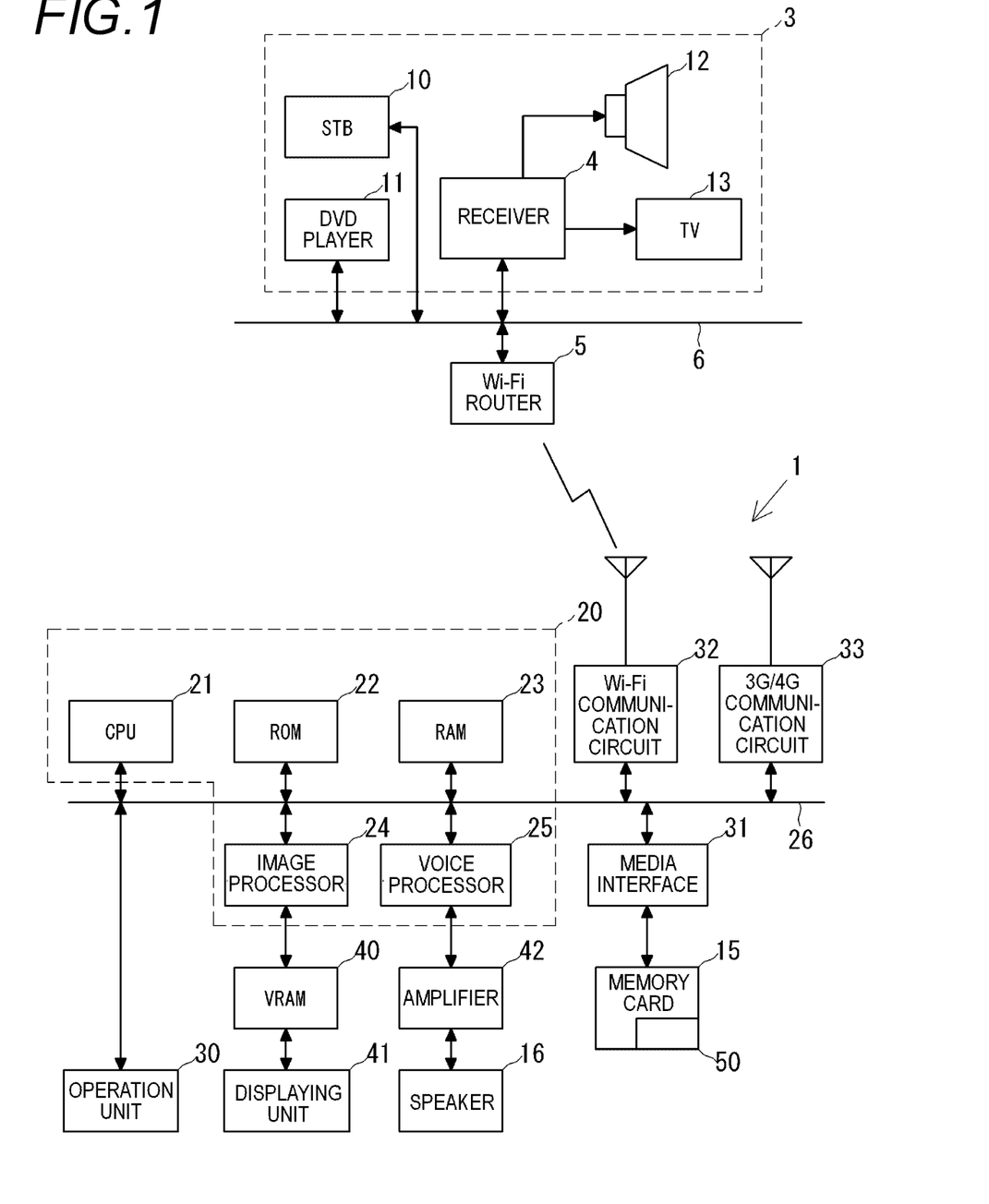
FIG. 1 is a block diagram illustrating a mobile phone and an audio system to which the present invention is applied.

FIG. 1 is a block diagram illustrating a mobile phone 1 which is a terminal device to which an embodiment of the present invention is applied, and an audio system 3.

It is preferable that a type of the mobile phone 1 is a so-called smart phone. The mobile phone (smart phone) 1 has a communication function of 3G/4G which is a mobile communication network, has a communication function of wireless LAN (Wi-Fi), and is connected to a network 6 through a Wi-Fi router 5. A receiver 4, which is a master device of the audio system 3, is also connected to the network 6. The receiver 4 receives and transmits sound and video signals.

The mobile phone 1 functions as an audio system controller 100 (hereinafter, simply referred to as the controller 100) illustrated in FIG. 2 by activating an audio system controller program 50 (hereinafter, simply referred to as the program 50) which is an application program (app), and controls the receiver 4 through the network 6 according to an operation performed by a user. A control function includes selection of an input source, on and off of electric power, up and down of a volume (sound volume) value, and the like.

Control of the volume value in the controller 100 is performed by a sliding operation (drag operation) with respect to a slider 418 which is displayed on the controller 100.

The audio system 3 is formed in such a way that a speaker 12 and a television (TV) 13 are connected to the receiver 4 which is a master device. The receiver 4, a set top box (STB) 10, and a DVD player 11 are connected to the network 6. The receiver 4 selects any one of a plurality of audio sources, outputs a reproduction (reception) video of the audio source to the television 13, and outputs (transmits) the reproduction (reception) video to the speaker 12. Although the selection of the audio source, the up and down of the volume value, and the like can be performed by directly operating an operation panel of the receiver 4, the selection of the audio source, the up and down of the volume value, and the like can be performed using the mobile phone 1 as described above. Meanwhile, a configuration of the audio system 3 is not limited to the drawing.

Subsequently, a configuration of the mobile phone 1 in which the program 50 is executed will be described. The mobile phone 1 includes a control unit 20, an operation unit 30, a media interface 31, a Wi-Fi communication circuit 32, and a 3G/4G communication circuit 33 on a bus 26. The control unit 20 includes a CPU 21, a ROM (flash memory) 22, a RAM 23, an image processor 24, and a voice processor 25. A video RAM (VRAM) 40 is connected to the image processor 24, and a displaying unit 41 is connected to the VRAM 40. The displaying unit 41 includes a liquid crystal display, and displays a standby screen, a telephone number, or the like. In addition, a screen of the controller 100 which will be described later is displayed on the displaying unit 41. An amplifier 42, which includes a D/A converter, is connected to the voice processor 25, and a speaker 16 is connected to the amplifier 42.

The image processor 24 includes a Graphics Processing Unit (GPU) which generates various video such as the standby screen and the telephone number. In a case where the program 50 is activated, the image processor 24 generates an image of the audio system controller according to an instruction of the CPU 21, and deploys the image on the VRAM 40. The image, which is deployed on the VRAM 40, is displayed on the displaying unit 41.

The voice processor 25 includes a Digital Signal Processor (DSP) which encodes and decodes telephone voice. The voice processor 25 outputs the decoded/generated voice to the amplifier 42. The amplifier 42 amplifies a voice signal and outputs the voice signal to the speaker 16.

The Wi-Fi communication circuit 32 performs wireless communication with the Wi-Fi router 5 in conformity to IEEE802.11g standards, and transmits and receives data and messages to and from equipment, such as the receiver 4, on the network 6. The messages are exchanged between the Wi-Fi communication circuit 32 and the receiver 4 in a format defined similarly to a Digital Living Network Alliance (DLNA). The 3G/4G communication circuit 33 performs a voice call and data communication through a mobile phone communication network. The application program is downloaded through data communication. Meanwhile, the application program may not only be downloaded through 3G/4G communication but also be acquired through Wi-Fi communication or an interface such as a USB.

The operation unit 30 includes a touch panel which is formed on the displaying unit 41, and detects a touch operation, the sliding operation, or the like with respect to the touch panel. A memory card 15 is connected to the media interface 31. The memory card 15 is, for example, a micro SD card. The application program, which is downloaded from a server by the 3G/4G communication circuit 33, is preserved in the memory card 15 or the ROM 22. In the mobile phone 1, the program 50 (application program) is preserved in the memory card 15 as illustrated in FIG. 1.

The program 50 includes data, which is necessary to execute a program, in addition to a program main body. The data which is necessary to execute the program includes, for example, a command table or the like. The command table is a table in which control content with respect to the audio system 3 is associated with a command which expresses the control content. The command table stores commands to on and off electric power of an AV receiver, to increase and reduce the sound volume, to select the DVD player or the STB as an input source, and the like. Meanwhile, the command which expresses the control content with respect to the audio system 3 may be associated with command storage.

The ROM 22 stores a basic program for executing a telephone call and the application program of the mobile phone 1. In addition, the ROM 22 is a flash memory, and is capable of storing a downloaded application program or the like in addition to the basic program. A work area, which is used in a case where the CPU 21 executes the program 50, is set in the RAM 23. In the work area, for example, a timer area, a counter area, a flag area, and the like of various data are provided.

Figure 2:
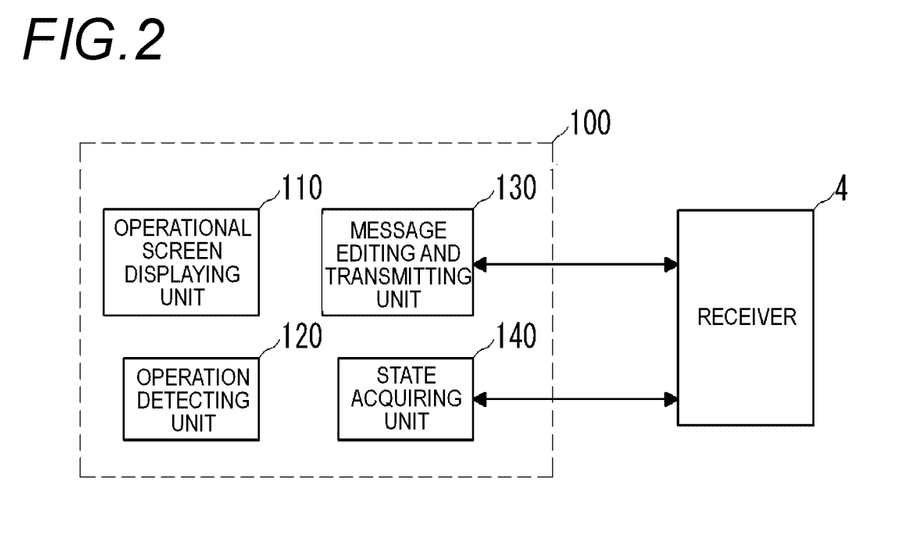
FIG. 2 is a block diagram illustrating a function of an audio system controller which is formed by cooperation of the mobile phone and an audio system controller program.

The mobile phone 1 forms the controller 100 as illustrated in FIG. 2 by cooperation with the program 50 which is preserved in the memory card 15, and controls the receiver 4 by transmitting a command message to the receiver 4 through Wi-Fi.

The controller 100, which is realized in such a way that the program 50 is read by the mobile phone 1 (hardware), will be described with reference to a functional block diagram of FIG. 2. The controller 100 includes an operational screen displaying unit 110, an operation detecting unit 120, a message editing and transmitting unit 130, and a state acquiring unit 140.

The operational screen displaying unit 110 is realized by the cooperation of the control unit 20, the VRAM 40, the displaying unit 41, and the program 50, and displays various operational screens on the displaying unit 41 of the mobile phone 1. The operational screen displaying unit 110 corresponds to an operational screen displaying unit according to the present invention.

The operation detecting unit 120 is realized by the cooperation of the control unit 20, the operation unit 30, and the program 50. The operation detecting unit 120 detects, for example, an operation, such as the touch operation or the sliding operation, with respect to the operational screen which is displayed on the displaying unit 41. Operational information, which is detected by the operation detecting unit 120 is input to the operational screen displaying unit 110, the message editing and transmitting unit 130, and the like. The operation detecting unit 120 corresponds to an operation detecting unit according to the present invention.

The message editing and transmitting unit 130 is realized by the cooperation of the control unit 20, the Wi-Fi communication circuit 32, and the program 50. The message editing and transmitting unit 130 reads a command corresponding to the operational information (control content) from the command table and edits the command message based on the operational information which is input from the operation detecting unit 120. Furthermore, the message editing and transmitting unit 130 transmits the command message to the receiver 4. The message editing and transmitting unit 130 corresponds to a parameter updating unit according to the present invention.

The state acquiring unit 140 is realized by the cooperation of the control unit 20, the Wi-Fi communication circuit 32, and the program 50. The state acquiring unit 140 queries with respect the receiver 4, and acquires an operating status of the receiver 4. The operating status includes an input source, a volume value, and the like which are selected at that time. The query is performed in a case where the controller 100 is activated, in a case where the receiver 4 is activated, or appropriately (for example, every 5 seconds, immediately after a command message is transmitted, or the like). The acquired volume value is reflected in the display of an operational screen 400 which is illustrated in FIG. 3.

Figure 3:
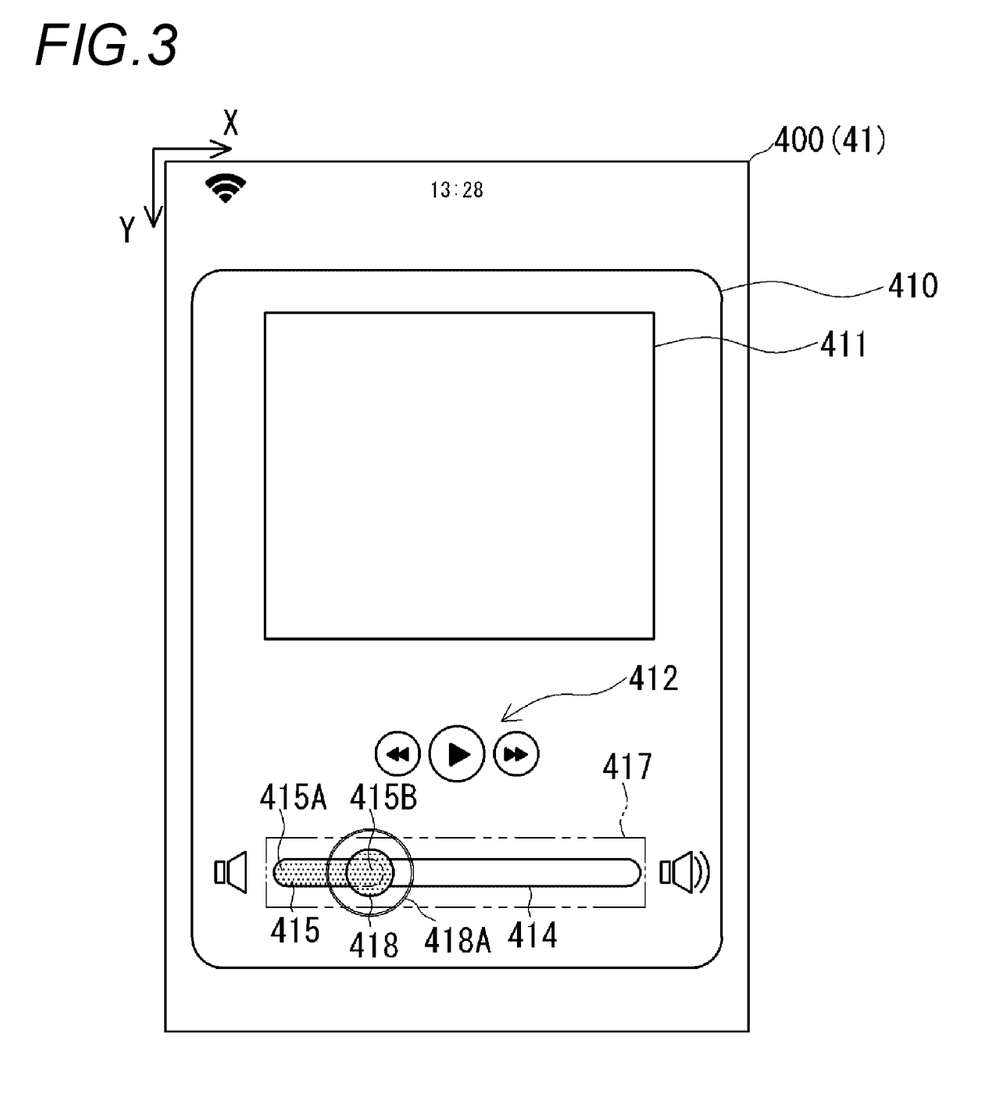
FIG. 3 is a diagram illustrating an example of display of a screen of the audio system controller.

FIG. 3 is a diagram illustrating an example of the operational screen 400 which is displayed by the operational screen displaying unit 110. The operational screen 400 is displayed on the displaying unit 41. The user is capable of operating the operational screen 400 using the touch panel (operation unit 30) which is superimposed on the displaying unit 41. FIG. 3 illustrates a reproduction control screen. In the reproduction control screen, the user is capable of controlling start/stop of the selected audio source, and up and down of the volume value. In the drawing, a window 410 is formed at a center of the operational screen 400. In the window 410, an image 411 which is associated with the selected audio source, a reproduction button group 412, a bar graph display area 414, a bar graph 415, a slider display area 417, and a slider 418 are displayed.

In the touch panel (operation unit 30), coordinate axes are set in order to grasp positions of the touch operation and the sliding operation (an operation of moving while being touched) on the displaying unit 41. In the embodiment, an upper left of the touch panel (operation unit 30) in the drawing is set to an origin, and a right side from the origin in the drawing is set to, an X axis and a downstream side from the origin in the drawing is set to a Y axis, respectively. The touch operation and the sliding operation are grasped as a change in coordinates of a position in which a finger F is in contact with the touch panel (operation unit 30). Meanwhile, in the description below, a position of a component in the displaying unit 41 will be described using a direction (up and down and right and left) of a posture illustrated in FIG. 3.

The reproduction button group 412 includes a reproduction and stop button, a fast-forwarding button, and a rewinding button. The touch operation for each button is detected by the operation detecting unit 120, and the operational information thereof is delivered to the message editing and transmitting unit 130. In the message editing and transmitting unit 130, in a case where the reproduction button is tapped, a reproduction start command or a stop command is transmitted to the receiver 4 according to a reproduction state at that time. In addition, in a case where the fast-forwarding button is tapped (touched), a subsequent music command or a fast-forwarding command is transmitted to the receiver 4 according to the reproduction state at that time. In addition, in a case where the rewinding button is tapped, a previous music command or a rewinding command is transmitted according to the reproduction state at that time.

In the bar graph display area 414, the bar graph 415 which has a length corresponding to a current volume value is displayed. The bar graph display area 414 extends in an X-axis direction. The bar graph display area 414 corresponds to a parameter displaying unit according to the present invention.

The bar graph 415 is a graph which expresses a volume value. The bar graph 415 extends on a right side (a positive direction of the X axis) as the volume value increases while a left end of the bar graph display area 414 is used as the origin, and contracts on a left side (a negative direction of the X axis) as the volume value is reduced. The volume value is expressed by a position of a right end of the bar graph 415. That is, the volume value is expressed by a length from the left end to the right end of the bar graph 415. It is assumed that the left end of the bar graph 415 is a first end 415A and the right end of the bar graph 415 is a second end 415B.

The slider display area 417 covers the whole bar graph display area 414, and the slider 418 is displayed in a position according to the volume value at that time or a user's operation.

The slider 418 is provided to increase and reduce the volume value according to the sliding operation. In FIG. 3, the slider 418 is disposed to be superimposed on the second end of the bar graph 415. It is possible to move the slider 418 to the right side and the left side along the X axis by the sliding operation performed by the user. In a case where the slider 418 is moved to the right side, the volume value is increased, and, in a case where the slider 418 is moved to the left side, the volume value is reduced. A position of the slider 418 is grasped using the coordinates. The movement amount of the slider 418 in left and right directions is grasped as displacement of an X coordinate. While the user is operating the slider 418, a contour line 418A is displayed around the slider 418. The contour line 418A is displayed to make clear a fact that the slider 418 is in the operation state and to make clear the position of the slider 418. The slider 418 corresponds to an operated portion according to the present invention.

In a case where the user performs the sliding operation on the slider 418 to the right side or the left side, operational information of the sliding operation is detected by the operation detecting unit 120, and is delivered to the message editing and transmitting unit 130 and the operational screen displaying unit 110. The message editing and transmitting unit 130 edits a command message to update the volume value, and transmits the command message to the receiver 4. The operational screen displaying unit 110 updates the bar graph display area 414 and display content of the slider display area 417 according to operation content.

In a case where the slider 418 is located at the left end of the bar graph display area 414, the volume value becomes a minimum. In a case where the slider 418 is located at the right end of the bar graph display area 414, the volume value becomes the maximum. It is possible to change the volume value between a minimum value and a maximum value by stages. It is possible to change the volume value, for example, by 100 stages from the minimum value to the maximum value. A first stage (one count) of the volume value is associated with the amount of the movement of the slider 418 in the left and right directions, that is, the displacement of the X coordinate. The volume value is changed by, for example, 0.5 dB in the first stage (one count) of operation target audio equipment (for example, receiver 4). For example, in a case where the slider 418 is moved by five counts from a current position in a volume increase direction (right side), the volume value increases by 2.5 dB. In addition, in a case where the slider 418 is moved by ten counts from the current position in a volume reduction direction (left side), the volume value is reduced by 5.0 dB.

Control, in which the volume value is increased and reduced by the controller 100 according to the embodiment, will be described with reference to FIGS. 4 to 6. In a case where the slider 418 is operated in a volume reduction direction (left side) or is slowly (equal to or lower than a threshold) operated in the volume increase direction (right side), the volume value, that is, the second end 415B (right end) of the bar graph 415 completely follows the slider 418 and becomes the same position. In a case where the slider 418 is operated at a speed which is equal to or larger than the threshold in the volume increase direction (right side), the volume value is late in following the slider 418.

First, control, in which the volume value is increased, will be described with reference to FIGS. 4A to 4D. FIGS. 4A to 4D illustrate an example of an operation of increasing the volume value by performing the sliding operation on the slider 418 to the right side along the X axis. The volume increase direction (the right side along the X axis) corresponds to a first direction according to the present invention.

Figure 4A:
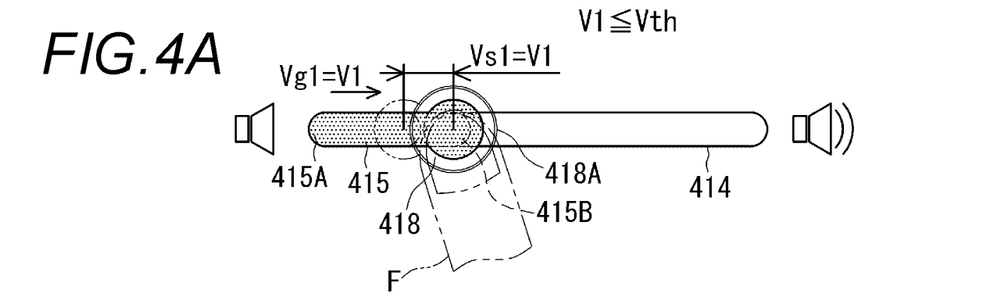
FIGS. 4A to 4D are diagrams illustrating each state in which volume increasing control is performed by a sliding operation.
Figure 4B:
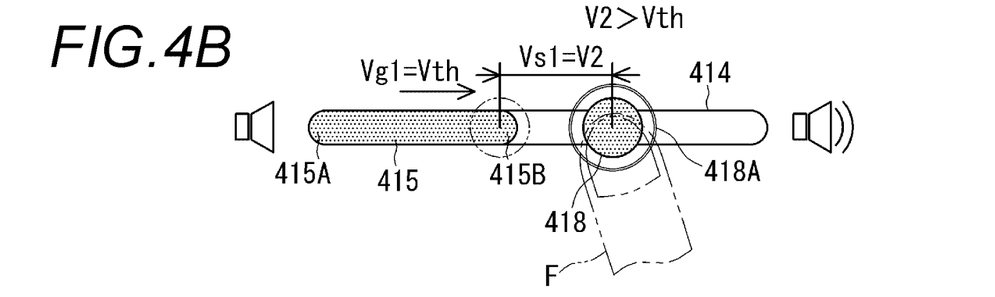

FIGS. 4A and 4B illustrate a state in which the user performs the sliding operation on the slider 418 in the volume increase direction (right side) with the finger F and the right end of the bar graph 415 extends in the volume increase direction (right side) according to the sliding operation. It is assumed that the movement amount of the slider 418 in the volume increase direction is Vs1. In addition, it is assumed that a ratio of change for the position of the right end of the bar graph 415 in the volume increase direction, that is, the movement amount of the bar graph 415 per unit time (for example, per one second) in the volume increase direction is Vg1. Meanwhile, the movement amount Vs1 of the slider 418 is not the movement amount per unit time but a value which expresses a difference (distance) between X coordinate values of the position of the slider 418, which is displayed in a position that follows (coincides with) a position of the finger of the user, and a position of the right end of the bar graph 415 which expresses the volume value. The movement amount Vs1 of the slider 418 in the volume increase direction corresponds to the operation amount in the first direction according to the present invention.

In a case where the position of the slider 418 is located on the right rather than the right end of the bar graph 415, the position of the right end of the bar graph 415 is changed at a moving velocity Vg1 in the volume increase direction. The moving velocity Vg1 of the bar graph 415 in the volume increase direction is expressed by, for example, the number of counts in which the right end of the bar graph 415 extends per unit time. For example, in a case where the right end of the bar graph 415 extends 3 counts per second, it is possible to express that Vg1=3 count/sec, and, in a case where the right end of the bar graph 415 moves 5 counts per second, it is possible to express that Vg1=5 count/sec.

The moving velocity Vg1 of the bar graph 415 in the volume increase direction, that is, an increase rate of the volume value is set to a first threshold Vth. The first threshold Vth is, for example, 5 count/sec. In FIG. 4A, the movement amount Vs1 of the slider 418 is V1, and V1 is equal to or smaller than the first threshold Vth (Vs1=V1≤Vth). That is, the movement amount Vs1 of the slider 418 is equal to or smaller than a value (Vth) of a maximum movement distance in which the right end of the bar graph 415 moves per unit time. In this case, the moving velocity Vg1 of the right end of the bar graph 415 is equivalent to the movement amount Vs1 of the slider 418 (Vg1=Vs1=V1). Therefore, the slider 418 moves in the volume increase direction according to the sliding operation performed by the user, and the bar graph 415 extends in the volume increase direction according to the movement of the slider 418. Therefore, the right end (second end 415B) of the bar graph 415 moves in the volume increase direction in a state of being superimposed on the slider 418. In addition, the volume value increases in response to the moving velocities of the slider 418 and the bar graph 415. That is, the movement amount Vs1 (deviation between the right end of the bar graph 415 and the slider 418) of the slider 418 in the volume increase direction is equal to or smaller than the first threshold Vth of the increase rate of the volume value, volume value increases in accordance with the movement of the slider 418.

FIG. 4B illustrates a state in which the user performs the sliding operation on the slider 418 in the volume increase direction (right side) at a high velocity with the finger F and the right end of the bar graph 415 extends in the volume increase direction (right side) at a moving velocity which is slower than the moving velocity of the slider 418. In addition, the state of the drawing is generated in a case where the user touches a position, which is separated to the right side rather than the right end of the bar graph 415 in the bar graph display area 414, with the finger F. That is, the slider 418 completely follows the touch of the finger F in the slider display area 417.

In FIG. 4B, the movement amount Vs1 of the slider 418 is V2, and V2 is larger than the first threshold Vth (Vs1=V2>Vth). In this case, the moving velocity Vg1 of the right end of the bar graph 415 does Not completely follow the movement amount Vs1 of the slider 418, and becomes equal to the first threshold Vth (Vg1=Vth). That is, the slider 418 moves in the volume increase direction in accordance with the sliding operation performed by the user, the bar graph 415 extends in the volume increase direction at a velocity which is slower than the moving velocity of the slider 418. Therefore, the right end of the bar graph 415 moves in the volume increase direction in a state of being separated from the slider 418 without being superimposed. In addition, the volume value increases in response to the moving velocity of the bar graph 415 instead of the slider 418.

That is, in a case where the movement amount Vs1 of the slider 418 in the volume increase direction exceeds the first threshold Vth, the volume value increases in accordance with the movement of the bar graph 415 instead of the slider 418. Therefore, even in a case where the slider 418 is improvidently largely slid on a volume increase side, it is possible to slowly increase the volume value. Therefore, it is possible to suppress the volume value from largely increasing in a short time and being high-sound volume unexpectedly. In a case where the user stops the slider 418 in a position illustrated in FIG. 4B and maintains the touch operation, the bar graph 415 (volume value) gradually arrives in the position of the slider 418 at the increase rate of the first threshold Vth.

Figure 4C:
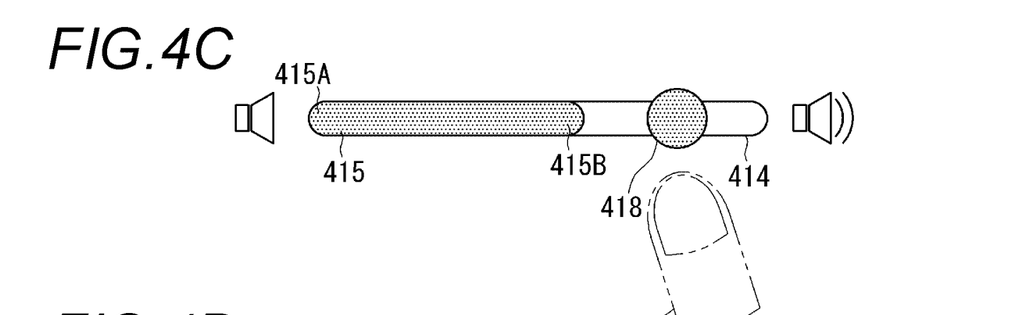

FIG. 4C illustrates a state of a moment at which the user separates the finger from the slider 418 and ends the operation. In a case where the user ends the sliding operation, control of the volume value, that is, control of the expansion and contraction of the bar graph 415 ends. The volume value is settled using the volume value corresponding to a position to which the right end of the bar graph 415 arrives at a point of time in which the operation of the slider 418 is stopped.

Figure 4D:
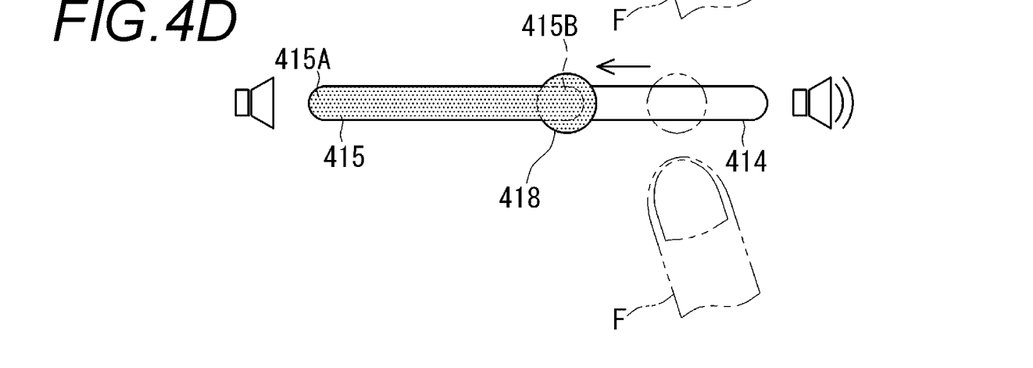

FIG. 4D illustrates a state in which the slider 418 moves to a position superimposed on the right end of the bar graph 415 (second end 415B) immediately after the state of FIG. 4C. As illustrated with reference to FIG. 4C, in a case where the operation of the slider 418 is ended (released), the volume value is settled using the volume value corresponding to the position at which the right end of the bar graph 415

(second end 415B) arrives. The slider 418 moves to the position superimposed on the right end of the bar graph 415 (second end 415B) in a short time so as to correspond to the settled volume value.

Subsequently, control of reducing the volume value will be described with reference to FIG. 5. FIG. 5 illustrates an example of an operation of reducing the volume value by performing the sliding operation on the slider 418 to the left side (a direction opposite to the first direction, hereinafter, referred to as a second direction) along the X axis.

Figure 5:
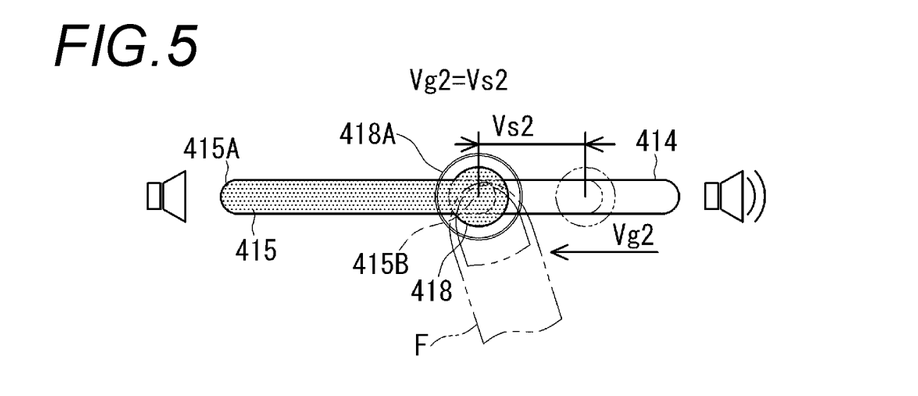
FIG. 5 is a diagram illustrating a state in which volume reducing control is performed by the sliding operation.

FIG. 5 illustrates a state in which the user performs the sliding operation on the slider 418 with the finger F in the volume reduction direction (second direction) and, accordingly, the right end of the bar graph 415 contracts in the volume reduction direction (second direction). It is assumed that the movement amount of the slider 418 in the volume reduction direction is Vs2. In addition, it is assumed that the movement amount of the right end of the bar graph 415 in the volume reduction direction per unit time (for example, per one second) is Vg2. Meanwhile, the movement amount Vs2 of the slider 418 is a value which expresses a difference (distance) in X coordinate values between the position of the slider 418 which is displayed in a position following (coinciding) the position of the finger of the user and the position of the right end of the bar graph 415 expressing the volume value instead of the movement amount of unit time.

The threshold is not set to the movement amount Vs2 of the slider 418 in the volume reduction direction (second direction). Therefore, regardless of the magnitude of the movement amount Vs2 of the slider 418, the moving velocity Vg2 of the right end of the bar graph 415 is equal to the movement amount Vs2 of the slider 418 (Vg2=Vs2). That is, the slider 418 moves in the volume reduction direction in accordance with the sliding operation performed by the user, and the bar graph 415 contracts in the volume reduction direction according to the movement of the slider 418. Therefore, the right end of the bar graph 415 (second end 415B) moves in the volume reduction direction in a state of being superimposed on the slider 418. In addition, the volume value is reduced in response to the moving velocity of the bar graph 415.

That is, regardless of the magnitude of the movement amount Vs2 (deviation between the right end of the bar graph 415 and the slider 418) of the slider 418 in the volume reduction direction, the volume value is reduced in accordance with the movement of the slider 418. Therefore, it is possible to rapidly reduce the volume value.

An operation of the controller 100 according to the embodiment in a case where the volume value is increased or reduced will be described with reference to a flowchart of FIG. 6.

In a case where the operation of the controller 100 starts (start), it is determined whether or not the sliding operation with respect to the slider 418 is performed (S1). In a case where the sliding operation with respect to the slider 418 is detected (YES in S1), the operational information detected by the operation detecting unit 120 is input to the operational screen displaying unit 110 and the message editing and transmitting unit 130. The operational screen displaying unit 110 updates a display position of the slider 418 according to the operation content with respect to the slider 418 (S2). While the user is operating the slider 418, the contour line 418A is displayed around the slider 418. The operation detecting unit 120 determines whether or not the slider 418 is operated in the volume increase direction (first direction) (S3).

In a case where it is determined that the slider 418 is operated in the volume increase direction (YES in S3), the operation detecting unit 120 detects the movement amount Vs1 of the slider 418 in the first direction based on the operation content for the slider 418. In addition, it is determined whether or not the movement amount Vs1 is equal to or smaller than a prescribed first threshold Vth (S4).

In a case where the movement amount Vs1 is equal to or smaller than the first threshold Vth (YES in S4), the message editing and transmitting unit 130 edits a command message relevant to the increase of the volume value corresponding to the movement amount Vs1 of the slider 418, and transmits the command message to the receiver 4 (S5). The operational screen displaying unit 110 associates the moving velocity Vg1 of the bar graph 415 with the movement amount Vs1 of the slider 418, and updates the display content of the bar graph 415 (S6). Thereafter, the process returns to step 1 (S1).

In contrast, in a case where the movement amount Vs1 of the slider 418 is larger than the first threshold Vth (NO in S4), the message editing and transmitting unit 130 edits a command message relevant to the increase of the volume value corresponding to the prescribed first threshold Vth instead of the movement amount Vs1 of the slider 418, and transmits the command message to the receiver 4 (S7). The operational screen displaying unit 110 associates the moving velocity Vg1 of the bar graph 415 with the first threshold Vth, and updates the display content of the bar graph 415 (S8). Thereafter, the process returns to step 1 (S1).

In addition, it is determined that the slider 418 is not operated in the volume increase direction in step 3 (No in S3), the operation detecting unit 120 detects the movement amount Vs2 of the slider 418 in a direction opposite to the first direction based on the operation content for the slider 418. The message editing and transmitting unit 130 edits a command message relevant to reduction of the volume value corresponding to the movement amount Vs2 of the slider 418, and transmits the command message to the receiver 4 (S9). The operational screen displaying unit 110 associates the moving velocity Vg2 of the bar graph 415 with the movement amount Vs2 of the slider 418, and updates the display content of the bar graph 415 (S10). Thereafter, the process returns to step 1 (S1).

In addition, in a case where it is determined that the sliding operation with respect to the slider 418 is not performed in step 1 (No in S1), the process returns to step 1 again in a state in which the slider 418 is caused to be matched with the right end of the bar graph 415 (second end 415B) (S11).

Meanwhile, in the embodiment described with reference to FIGS. 3 to 6, volume is slowly increased by providing the threshold Vth only in a case where the volume is increased. However, the volume may be slowly reduced by providing the threshold in a case where the volume is reduced.

Subsequently, control, in which the volume value is minutely adjusted by the controller 100 according to the embodiment, will be described with reference to FIGS. 7 and 8. In the controller 100, it is possible to minutely adjust the volume value by causing the finger F, which is performing the touch operation on the slider 418, to deviate from the slider display area 417 while touching the touch panel, moving the finger F in the Y-axis direction (upper part in the drawing), and causing the finger F to perform the sliding operation in the position in the X-axis direction (right side or left side in the drawing). FIGS. 7A to 7C illustrate a form of movement of the finger F and a form of change of the volume value (bar graph 415). It is possible to operate the slider 418 in the volume increase direction (first direction) and the volume reduction direction (second direction) on the virtual line Y0 along the X-axis direction. The Y-axis direction (upper part in the drawing) with respect to the slider 418 is different from both the volume increase direction (first direction) and the volume reduction direction (second direction), and corresponds to a third direction according to the present invention.

Also, in the embodiment, the following operations are performed in a case where the finger F, which is performing the touch operation on the slider 418, deviates from the slider 418 while touching the touch panel, and is moved in the Y-axis direction (upper part in the drawing). The following operation is not performed even in a case where the touch operation is performed in a position, which deviates from the slider 418, from the beginning without performing the touch operation on the slider 418.

Figure 7A:
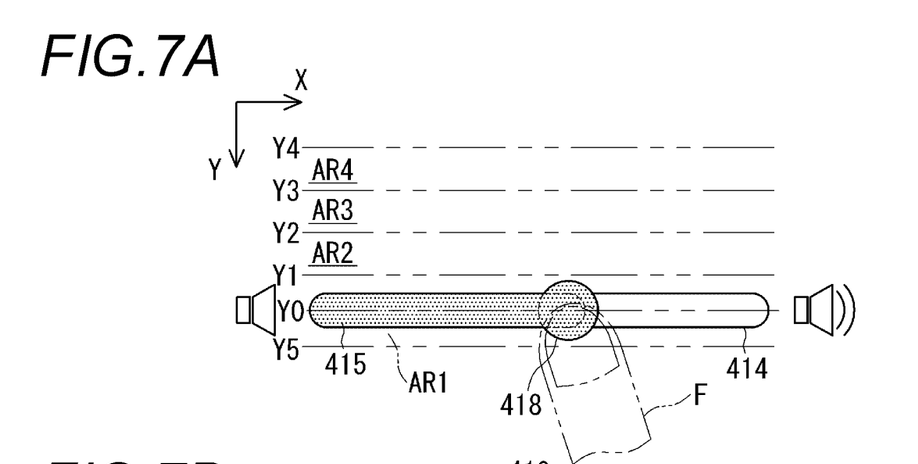
FIGS. 7A to 7C are diagrams illustrating each state in which volume is minutely adjusted by the sliding operation.

FIG. 7A illustrates a state in which the slider 418 is touched by the finger F. In the bar graph display area 414, a virtual line Y0 which is parallel to the X axis is set as described above. A virtual line Y1 and a virtual line Y5 are set at intervals in the Y-axis direction with respect to the virtual line Y0. The virtual line Y1 is disposed in a negative direction of the Y axis with respect to the virtual line Y0, and the virtual line Y5 is disposed in a positive direction of the Y axis with respect to the virtual line Y0. It is assumed that an area interposed between the virtual line Y5 and the virtual line Y1 is a first virtual area AR1. The first virtual area AR1 corresponds to a normal operation area according to the present invention.

Virtual lines Y2, Y3, and Y4, which are parallel to the X axis and are disposed at equivalent intervals in the Y-axis direction, are set at the upper part of the virtual line Y1. The virtual lines Y2, Y3, and Y4 are set in this order. A second virtual area AR2 is set between the virtual lines Y1 and Y2. Similarly, a third virtual area AR3 is set between the virtual lines Y2 and Y3 and a fourth virtual area AR4 is set between the virtual lines Y3 and the Y4. Each of the second virtual area AR2, the third virtual area AR3, and the fourth virtual area AR4 corresponds to a minute adjustment area according to the present invention.

Figure 7B:
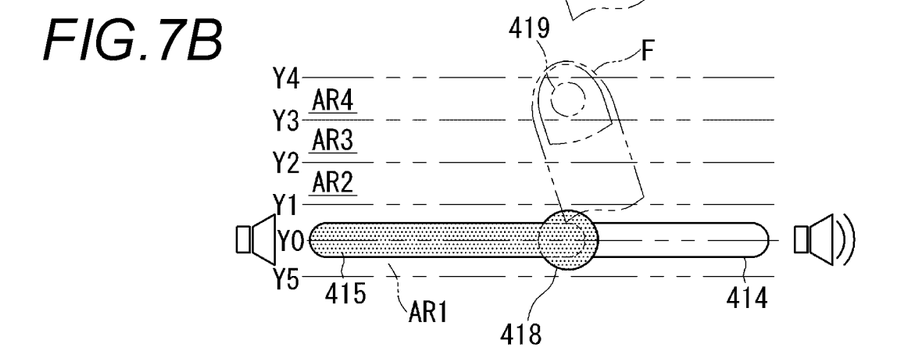

FIG. 7B illustrates a state which causes the finger F to perform the sliding operation from the slider 418 to the fourth virtual area AR4 in the Y-axis direction while the touch panel (operation unit 30) is touched by the finger F, subsequent to FIG. 7A. Even in a case where the finger F is caused to perform the sliding operation in the Y-axis direction, the slider 418 does not move in the Y-axis direction. In FIG. 7B, a position in which the finger F touches the fourth virtual area AR4 is expressed using the virtual lines as a contact position 419. Although the contact position 419 is not displayed on the displaying unit 41, the contact position 419 may be displayed using a figure or the like.

Figure 7C:
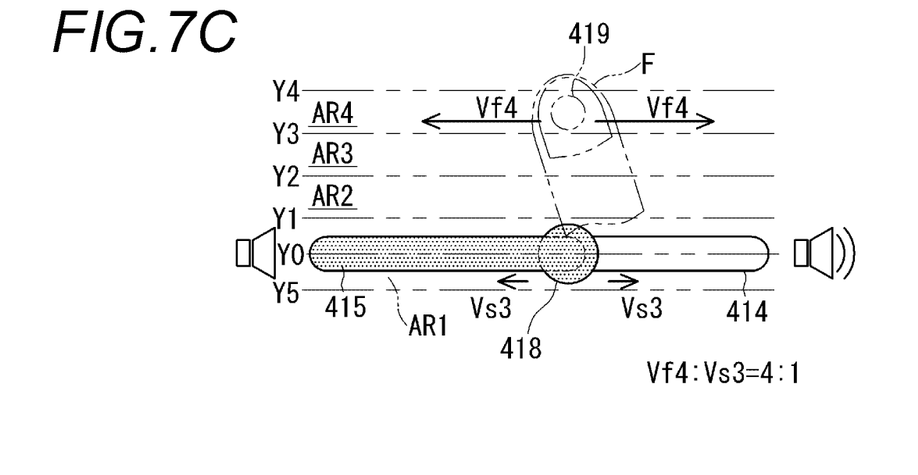

FIG. 7C illustrates a state in which the volume value is minutely adjusted by causing the finger F (contact position 419) to perform the sliding operation in the X-axis direction (the right side or the left side in the drawing) in the fourth virtual area AR4, subsequent to FIG. 7B. In a case where the finger F is caused to perform the sliding operation (contact position 419) in the X-axis direction in the fourth virtual area AR4, the slider 418 also moves in the X-axis direction in response to the sliding operation.

It is assumed that the movement amount of the position of the finger F (contact position 419) in the fourth virtual area AR4 in the X-axis direction is movement amount Vf4 and that the movement amount of a position of the slider 418 corresponding to the movement amount of the position of the finger F is reduced movement amount Vs3. A prescribed reduction ratio is set in advance between the movement amount Vf4 and the reduced movement amount Vs3. For example, a reduction ratio (reduction ratio of 0.25 times) is set as movement amount Vf4:reduced movement amount Vs3=4:1. In this case, a ratio of the movement amount Vf4 of the finger F (contact position 419) to the reduced movement amount Vs3 of the slider 418 becomes 1/4.

In addition, in a case where it is assumed that the movement amount of the finger F (contact position 419) in the third virtual area AR3 is the movement amount Vf3, for example, a reduction ratio (reduction ratio of 0.33 times) is set as movement amount Vf3:reduced movement amount Vs3=3:1. In this case, a ratio of the movement amount Vf3 of the finger F (contact position 419) to the reduced movement amount Vs3 of the slider 418 becomes 1/3.

Similarly, in a case where it is assumed that the movement amount of the finger F (contact position 419) in the second virtual area AR2 is the movement amount Vf2, for example, reduction ratio (reduction ratio of 0.5 times) is set as movement amount Vf2:reduced movement amount Vs3=2:1. In this case, a ratio of the movement amount Vf2 of the finger F (contact position 419) to the reduced movement amount Vs3 of the slider 418 becomes 1/2. As described above, in a case where the sliding operation is performed by the finger F (contact position 419) in the virtual areas AR4, AR3, and AR2 which are the minute adjustment areas, the slider 418 is operated by the reduced movement amount which is reduced at the prescribed reduction ratio with respect to the movement amount of the finger F (contact position 419). Therefore, it is possible to minutely adjust the position of the slider 418 while the finger F (contact position 419) largely performs the sliding operation, and it is easy to minutely adjust the volume value.

Also, in the first virtual area AR1 which corresponds to the normal operation area according to the present invention, a reduction ratio (reduction ratio of 1.0 times) is set as movement amount Vf1:reduced movement amount Vs3=1:1. In this case, a ratio of the movement amount Vf2 of the finger F (contact position 419) to the reduced movement amount Vs3 of the slider 418 is 1 and does not change. The reason for this is that the first virtual area AR1 is close to the slider 418 and, in a case where the sliding operation is performed in the area, the finger F may touch the slider 418. It is possible to suppress an operation, which is not expected by the user, by performing the same operation in a case where the sliding operation is directly performed on the slider 418 in the area which is close to the slider 418.

The operation of the controller 100 according to the embodiment performed in a case where the volume value is minutely adjusted will be described with reference to a flowchart of FIG. 8.

In a case where the operation of the controller 100 starts (start), the operation detecting unit 120 determines whether or not a movement operation, which is performed in an area separated from the slider 418 in the third direction (Y-axis direction), is performed in the fourth virtual area AR4 (S32).

In a case where it is determined that the movement operation is performed in the fourth virtual area AR4 (YES in S32), the operation detecting unit 120 selects a prescribed reduction ratio (movement amount Vf4:reduced movement amount Vs3=4:1) which is associated with the fourth virtual area AR4 in advance (S32). Furthermore, the operation detecting unit 120 calculates the reduced movement amount Vs3=Vf4/4 based on the movement amount Vf4 and the prescribed reduction ratio (Vf4:Vs3=4:1) (S33). The operational information, which is acquired by the operation detecting unit 120, is input to the operational screen displaying unit 110 and the message editing and transmitting unit 130. The operational screen displaying unit 110 updates the display position of the slider 418 according to the reduced movement amount Vs3 which is calculated (S34).

The message editing and transmitting unit 130 edits a command message relevant to the volume value corresponding to the reduced movement amount Vs3 of the slider 418, and transmits the command message to the receiver 4 (S35). The operational screen displaying unit 110 updates the display content of the bar graph 415 in association with the reduced movement amount Vs3 of the slider 418 (S36), and, in a case where the sliding operation is released, the operation of the controller 100 ends (end).

In contrast, in a case where the movement operation is not performed in the fourth virtual area AR4 (NO in S31), the operation detecting unit 120 determines whether or not the third operation is performed in the third virtual area AR3 (S37).

In a case where it is determined that the movement operation is performed in the third virtual area AR3 (YES in S37), the operation detecting unit 120 selects the prescribed reduction ratio (the movement amount Vf3:the reduced movement amount Vs3=3:1) which is associated with the third virtual area AR3 in advance (S38). Furthermore, the operation detecting unit 120 calculates the reduced movement amount Vs3=Vf3/3 based on the movement amount Vf3 and the prescribed reduction ratio (Vf3:Vs3=3:1) (S39). Subsequently, step 34 (S34), step 35 (S35), and step 36 (S36) are executed. The executed content is the same as the above-described content, and thus detailed description thereof will not be repeated. In a case where the sliding operation is released, the operation of the controller 100 ends (end).

In addition, in a case where the movement operation is not performed in the third virtual area AR3 (NO in S37), the operation detecting unit 120 determines whether or not the movement operation is performed in the second virtual area AR2 (S40).

In a case where it is determined that the movement operation is performed in the second virtual area AR2 (YES in S40), the operation detecting unit 120 selects the prescribed reduction ratio (the movement amount Vf2:the reduced movement amount Vs3=2:1) which is associated with the second virtual area AR2 in advance (S41). Furthermore, the operation detecting unit 120 calculates the reduced movement amount Vs3=Vf2/2 based on the movement amount Vf2 and the prescribed reduction ratio (Vf2:Vs3=2:1) (S42). Subsequently, step 34 (S34), step 35 (S35), and step 36 (S36) are executed. The executed content is the same as the above-described content, and thus detailed description thereof will not be repeated. In a case where the sliding operation is released, the operation of the controller 100 ends (end).

In addition, in a case where the movement operation is not performed in the second virtual area AR2 (NO in S40), the operation detecting unit 120 determines whether or not the movement operation is performed in the first virtual area AR1 (S43).

In a case where it is determined that the movement operation is performed in the first virtual area AR1 (YES in S43), the operation detecting unit 120 selects the prescribed reduction ratio (the movement amount Vf1:the reduced movement amount Vs3=1:1) which is associated with the first virtual area AR1 in advance (S44). Furthermore, the operation detecting unit 120 calculates the reduced movement amount Vs3=Vf1/1 based on the movement amount Vf1 and the prescribed reduction ratio (Vf1:Vs3=1:1) (S45). Subsequently, step 34 (S34), step 35 (S35), and step 36 (S36) are executed. The executed content is the same as the above-described content, and thus detailed description thereof will not be repeated. In a case where the sliding operation is released, the operation of the controller 100 ends (end). In a case where it is determined that the movement operation is not performed in the first virtual area AR1 (NO in S43), the process returns to step 31 (S31).

In the embodiment described with reference to FIGS. 7 and 8, an example in which the finger F sets the virtual areas at the upper part (negative direction of the Y axis) of the bar graph display area 414 from the bar graph display area 414 is described. However, the virtual areas may be set at a lower part of the bar graph display area 414. In addition, the three virtual areas, which have different reduction ratios, are superimposed. However, the number of virtual areas is not limited to 3 (the number of virtual areas may be one). In addition, it is possible to continuously calculate the ratio of change according to the distance between the position of the finger F and the bar graph display area 414 in the Y-axis direction without changing the ratio of change per each of the plurality of virtual areas.

In the embodiment described with reference to FIGS. 7 and 8, a minutely adjusting process is performed in a case where the finger F which touches the slider 418 is moved in the Y direction while the finger F is not separated from the touch panel. Even though the finger F does not touch the slider 418, the minutely adjusting process may be performed in a case where the finger F is caused to touch a position which is separated from the bar graph 415 in the Y direction with some operations.

Figure 6:
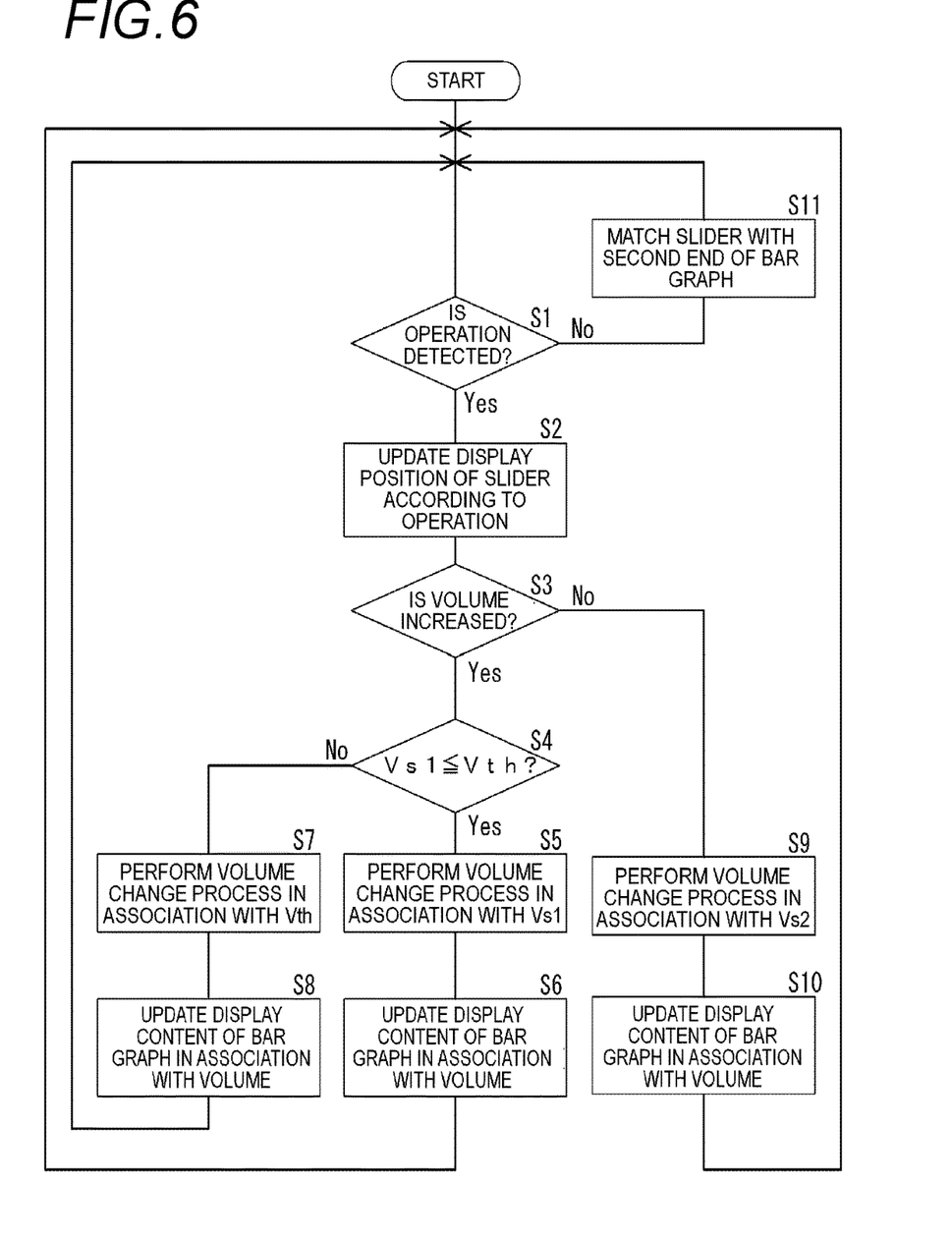
FIG. 6 is a flowchart illustrating an operation performed by the audio system controller.
Figure 8:
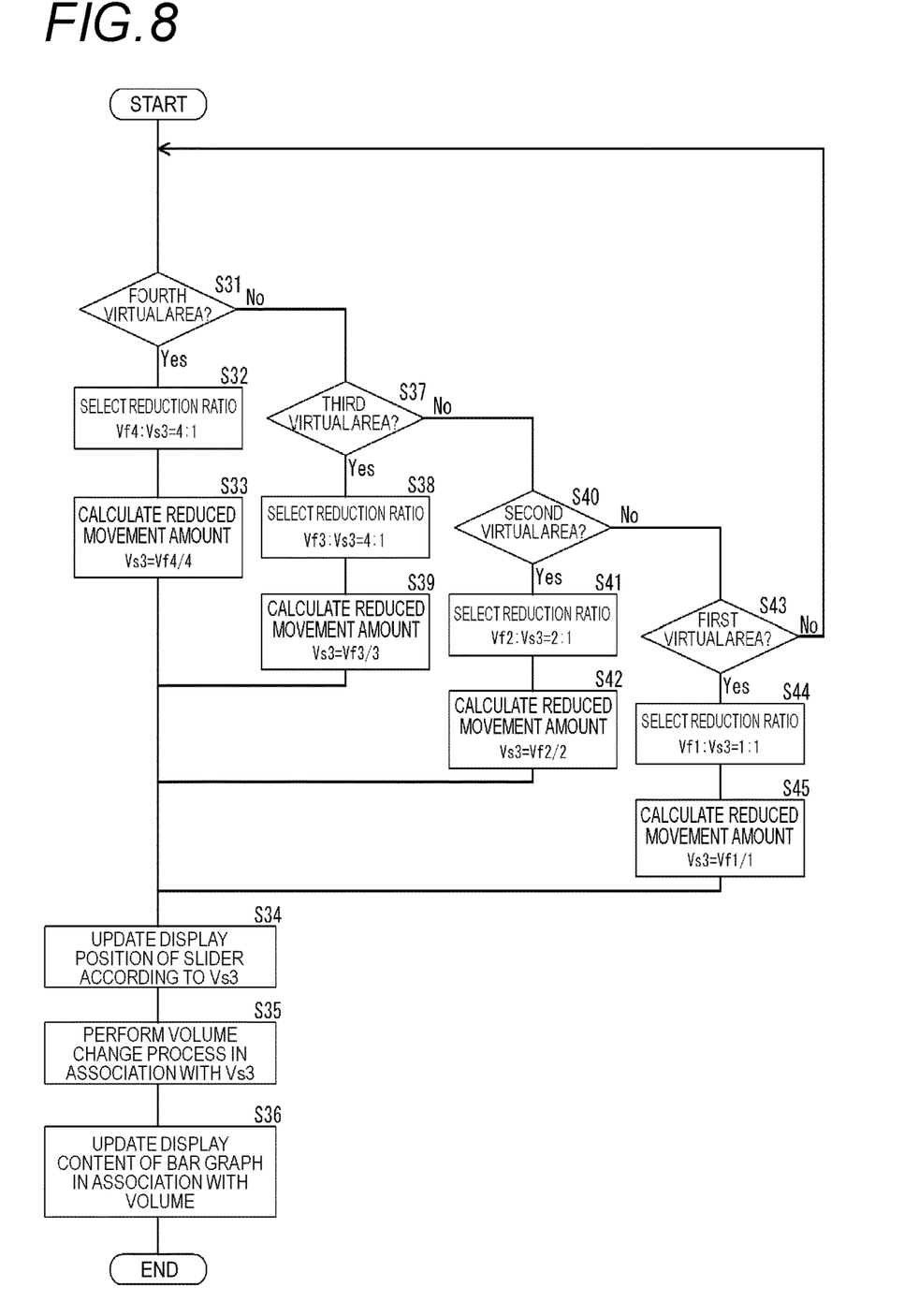
FIG. 8 is a flowchart illustrating an operation performed by the audio system controller.

The function of causing the volume value to be late in following the operation of the slider 418 with reference to FIGS. 4 to 6 may be combined with the function of minutely adjusting the volume with reference to FIGS. 7 and 8.

In the embodiment, the mobile phone 1 is provided as an example of the terminal device to which the present invention is applied, and the terminal device is not limited to the mobile phone 1. For example, the terminal device may be a tablet or a dedicated controller terminal device.

In the embodiment, the volume value is provided as an example. However, as long as a parameter which is continuously and smoothly increases/reduces, it is possible to apply any type of another parameter.

A parameter control device provided by a first aspect of the present invention includes: an operated portion; an operation detecting unit that detects an operation on the operated portion; an operational screen displaying unit that updates a display position of the operated portion according to the operation on the operated portion; and a parameter updating unit that updates a value of a parameter with respect to controlled equipment according to the operation on the operated portion, wherein the parameter updating unit updates the parameter according to an operation amount in a case where the operation amount with respect to the operated portion is equal to or lower than a prescribed threshold, updates the parameter according to a value of the threshold in a case where the operation amount exceeds the threshold, and stops a process of updating the parameter in a case where the operation detecting unit detects release of the operation on the operated portion, and wherein, in a case where the process of updating the parameter stops, the operational screen displaying unit updates the display position of the operated portion to a display position according to the value of the parameter at that time.

In the first aspect, the parameter updating unit may update the parameter according to the operation amount in a case where the operation amount with respect to the operated portion in a first direction is equal to or smaller than the prescribed threshold or in a case where an operation with respect to the operated portion is performed in a direction opposite to the first direction, and update the parameter according to the value of the threshold in a case where the operation amount with respect to the operated portion in the first direction exceeds the threshold.

In the first aspect, the parameter control device may be configured to further include a parameter displaying unit that includes a first end which is fixed and a second end which moves according to the value of the parameter, and displays an image according to the value of the parameter, wherein, in a case where the operated portion is not being operated, the operational screen displaying unit displays the operated portion in a position which coincides with the second end of the parameter displaying unit.

The parameter displaying unit may display a bar graph-shaped image which expands and contracts according to the value of the parameter.

In a case where the operated portion is operated, the operational screen displaying unit may update display of the operated portion in a position which is separated from the second end as much as the operation amount, and the parameter displaying unit may cause the bar graph to expand and contract at a ratio of change corresponding to a ratio of change for the parameter, and moves the second end.

A parameter control device provided by a second aspect of the present invention includes: an operated portion that is capable of moving on a virtual line; a parameter displaying unit that displays a prescribed parameter; an operation detecting unit that detects a movement operation along the line; and an operational screen displaying unit that updates a position of the operated portion according to the movement operation, and updates display content of the parameter displaying unit according to a display position of the operated portion, wherein the operation detecting unit sets a direction, which is different from a direction of the line, to a third direction, and, in a case where the movement operation along the line is detected in an area which is separated from the line in the third direction, detects a distance between a position of the operation and the line in the third direction, and determines a reduction ratio of the movement operation according to the distance in the third direction, and wherein the operational screen displaying unit updates the display position of the operated portion using a value acquired by reducing a movement amount of the movement operation at the reduction ratio, and updates the display content of the parameter displaying unit.

In the second aspect, it may be assumed that an area, in which a distance separated from the line in the third direction is shorter than a prescribed distance, is a normal operation area, and an area, in which the distance separated from the line in the third direction is equal to or longer than the prescribed distance, is a minute adjustment area, the reduction ratio is set to 1 in a case where the movement operation is detected in the normal operation area, and the reduction ratio is set to a value which is smaller than 1 in a case where the movement operation is detected in the minute adjustment area.

In a case where an operation of moving the position of the operation from the normal operation area to the minute adjustment area is detected, the operational screen displaying unit may apply the reduction ratio with respect to the subsequent movement operation in the minute adjustment area.

The minute adjustment area may be divided into a plurality of partial areas according to the distance in the third direction, and different reduction ratios may be respectively set in the respective partial areas.

A parameter control program provided by a third aspect of the present invention is a parameter control program which causes a control unit of a mobile terminal device, in which an operated portion is provided, to function as an operation detection means for detecting an operation on the operated portion, an operational screen display means for updating a display position of the operated portion according to the operation on the operated portion, and a parameter updating means for updating a value of a parameter with respect to controlled equipment according to the operation on the operated portion, wherein the parameter updating means updates the parameter according to operation amount in a case where the operation amount with respect to the operated portion is equal to or lower than a prescribed threshold, updates the parameter according to a value of the threshold in a case where the operation amount exceeds the threshold, and stops a process of updating the parameter in a case where the operation detection means detects release of the operation on the operated portion, and wherein, in a case where the process of updating the parameter stops, the operational screen display means updates the display position of the operated portion to a display position according to the value of the parameter at that time.

A parameter control program provided by a fourth aspect of the present invention is a parameter control program which causes a control unit of a mobile terminal device, which includes an operated portion that is capable of moving on a virtual line, to function as a parameter display means for displaying a prescribed parameter, an operation detection means for detecting a movement operation along the line, and an operational screen display means for updating a position of the operated portion according to the movement operation and updating display content of the parameter display means according to a display position of the operated portion, wherein the operation detection means sets a direction, which is different from a direction of the line, to a third direction, and, in a case where the movement operation along the line is detected in an area which is separated from the line in the third direction, detects a distance between a position of the operation and the line in the third direction, and determines a reduction ratio of the movement operation according to the distance in the third direction, and wherein the operational screen display means updates the display position of the operated portion using a value acquired by reducing a movement amount of the movement operation at the reduction ratio, and updates the display content of the parameter display means.

A parameter control method provided by a fifth aspect of the present invention is a parameter control method in a mobile terminal device, which includes an operated portion that is capable of moving on a virtual line, the method including: detecting an operation amount on the operated portion; updating a parameter with respect to controlled equipment according to the operation amount in a case where the detected operation amount is equal to or smaller than a prescribed threshold, and updating the parameter according to a value of the threshold in a case where the operation amount exceeds the threshold; stopping a process of updating a value of the parameter in a case where release of an operation on the operated portion is detected; and updating the display position of the operated portion to a display position according to the value of the parameter at that time in a case where the process of updating stops.

In the fifth aspect, the parameter control method may update the parameter according to the operation amount in a case where the operation amount with respect to the operated portion in a first direction is equal to or smaller than the prescribed threshold or in a case where an operation with respect to the operated portion is performed in a direction opposite to the first direction; and update the parameter according to the value of the threshold in a case where the operation amount with respect to the operated portion in the first direction exceeds the threshold.

The mobile terminal device may further include a parameter displaying unit that includes a first end which is fixed and a second end which moves according to the value of the parameter, and displays an image according to the value of the parameter, and in a case where the operated portion is not being operated, the operated portion may be displayed in a position which coincides with the second end of the parameter displaying unit.

The parameter displaying unit may display a bar graph-shaped image which expands and contracts according to the value of the parameter.

In a case where the operated portion is operated, the parameter control method may update display of the operated portion in a position which is separated from the second end as much as the operation amount; and cause the bar graph to expand and contract at a ratio of change corresponding to a ratio of change for the parameter, and moving the second end.

Reference signs corresponding to some elements are listed below.

1: Mobile Phone
4: Receiver
15: Memory Card
20: Control Unit
41: Displaying Unit
50: Audio System Controller Program
100: Audio System Controller
415: Bar Graph
418: Slider

What is claimed is:

1. A parameter control device comprising:
 a display device;
 a memory storing instructions; and
 a processor that implements the instructions to execute a plurality of tasks, including:
  a displaying task that controls the display device to display a parameter display region that includes an end position that moves according to a current value of a parameter with respect to a controlled equipment and an operated portion initially displayed at the end position;
  a detecting task that detects an operation on the operated portion, including an operation amount of the operation and release of the operation on the operated portion;
  a first parameter updating task that, in response to the detecting task detecting a first operation on the operated portion with a first operation amount equal to or less than a predetermined threshold:
   updates the current value of the parameter according to the first operation amount; and
   stops updating the current value of the parameter upon the detecting task detecting release of the first operation on the operated portion;
  a second parameter updating task that, in response to the detecting task detecting a second operation on the operated portion with a second operation amount exceeding the predetermined threshold:
   updates the current value of the parameter to an amount less than the second operation amount that is equal to the amount of the predetermined threshold; and
   stops updating the current value of the parameter upon the detecting task detecting release of the second operation on the operated portion; and
  a display updating task that updates a current display position of the operated portion in the display device:
   for the first operation, moving the current display position of the operated portion and the end position according to the first operation amount; and
   for the second operation, moving the current display position of the operated portion according to the second operation amount and moving the end position according to the predetermined threshold, and upon the detecting task detecting release of the second operation, moving the current display position of the operated portion to a position corresponding to the end position.

2. The parameter control device according to claim 1, wherein the second parameter updating task updates the parameter to the predetermined threshold only in a case where the operated portion is operated in a first direction.

3. The parameter control device according to claim 1, wherein the parameter display region includes a fixed end that is fixed and a movable end that is movable according to the value of the parameter, the movable end corresponding to the end position.

4. The parameter control device according to claim 3, wherein the parameter display region displays a bar graph-shaped image where the movable end expands and contracts according to the updated value of the parameter.

5. A non-transitory computer-readable storage medium storing a program executable by a processor of a mobile terminal device including a display device to execute a method comprising:
 controlling the display device to display a parameter display region that includes an end position that moves according to a current value of a parameter with respect to a controlled equipment and an operated portion initially displayed at the end position;
 detecting an operation on the operated portion, including an operation amount of the operation and release of the operation on the operated portion;
 in response to the detecting detecting a first operation on the operated portion with a first operation amount equal to or less than a predetermined threshold:
  updating the current value of the parameter according to the first operation amount; and
  stopping updating the current value of the parameter upon the detecting detecting release of the first operation on the operated portion;
 in response to the detecting detecting a second operation on the operated portion with a second operation amount exceeding the predetermined threshold:
  updating the current value of the parameter to an amount less than the second operation amount that is equal to the amount of the predetermined threshold; and
  stopping updating the current value of the parameter upon the detecting detecting release of the second operation on the operated portion; and updating a current display position of the operated portion in the display device:
　　for the first operation, moving the current display position of the operated portion and the end position according to the first operation amount; and
　　for the second operation, moving the current display position of the operated portion according to the second operation amount and moving the end position according to the predetermined threshold, and upon the detecting detecting release of the second operation, moving the current display position of the operated portion to a position corresponding to the end position.

6. A parameter control method for a mobile terminal device including a display devices, the method comprising:
　controlling the display device to display a parameter display region that includes an end position that moves according to a current value of a parameter with respect to a controlled equipment and an operated portion initially displayed at the end position;
　detecting an operation on the operated portion, including an operation amount of the operation and release of the operation on the operated portion;
　in response to the detecting detecting a first operation on the operated portion with a first operation amount equal to or less than a predetermined threshold:
　　updating the current value of the parameter according to the first operation amount; and
　　stopping updating the current value of the parameter upon the detecting detecting release of the first operation on the operated portion;
　in response to the detecting detecting a second operation on the operated portion with a second operation amount exceeding the predetermined threshold:
　　updating the current value of the parameter to an amount less than the second operation amount that is equal to the amount of the predetermined threshold; and
　　stopping updating the current value of the parameter upon the detecting detecting release of the second operation on the operated portion; and
　updating a current display position of the operated portion in the display device:
　　for the first operation, moving the current display position of the operated portion and the end position according to the first operation amount; and
　　for the second operation, moving the current display position of the operated portion according to the second operation amount and moving the end position according to the predetermined threshold, and upon the detecting detecting release of the second operation, moving the current display position of the operated portion to a position corresponding to the end position.

7. The parameter control method according to claim 6, the updating of the parameter to the predetermined threshold updates the parameter to the predetermined threshold only in a case where the operated portion is operated in a first direction.

8. The parameter control method according to claim 6, wherein the parameter display region includes a fixed end that is fixed and a movable end that is movable according to the value of the parameter, the movable end corresponding to the end position.

9. The parameter control method according to claim 8, wherein the parameter display region displays a bar graph-shaped image where the movable end expands and contracts according to the updated value of the parameter.

* * * * *